(12) United States Patent
Bober

(10) Patent No.: US 9,063,179 B2
(45) Date of Patent: Jun. 23, 2015

(54) SYSTEM AND METHOD FOR DETERMINING AN ISOLATION RESISTANCE OF A BATTERY PACK DISPOSED ON A VEHICLE CHASSIS

(71) Applicant: Greg Bober, Saint Clair Shores, MI (US)

(72) Inventor: Greg Bober, Saint Clair Shores, MI (US)

(73) Assignee: LG Chem, Ltd., Seoul (KR)

( * ) Notice: Subject to any disclaimer, the term of this patent is extended or adjusted under 35 U.S.C. 154(b) by 370 days.

(21) Appl. No.: 13/626,915

(22) Filed: Sep. 26, 2012

(65) Prior Publication Data

US 2014/0084934 A1 Mar. 27, 2014

(51) Int. Cl.
  *G01R 31/08* (2006.01)
  *G01R 27/08* (2006.01)
  *G01N 27/416* (2006.01)
  *G01R 27/02* (2006.01)
  *G01R 31/36* (2006.01)

(52) U.S. Cl.
  CPC .............. *G01R 27/025* (2013.01); *G01R 31/36* (2013.01)

(58) Field of Classification Search
  CPC ............................ G01R 27/025; G01R 27/205
  USPC ......................................... 324/525, 430, 691
  See application file for complete search history.

(56) References Cited

U.S. PATENT DOCUMENTS

| 4,214,204 | A | 7/1980 | Eberle |
| 4,311,917 | A | 1/1982 | Hencey, Jr. et al. |
| 4,363,407 | A | 12/1982 | Buckler et al. |
| 5,357,423 | A | 10/1994 | Weaver et al. |
| 5,901,572 | A | 5/1999 | Peiffer et al. |
| 6,138,466 | A | 10/2000 | Lake et al. |
| 6,762,610 | B1 | 7/2004 | Brilmyer et al. |
| 7,109,700 | B2 | 9/2006 | Fazzina |
| 7,564,248 | B2 * | 7/2009 | Breese et al. ................. 324/691 |
| 7,915,856 | B2 | 3/2011 | Krampitz et al. |

(Continued)

FOREIGN PATENT DOCUMENTS

| GB | 2291737 A | 1/1996 |
| JP | S5999271 A | 6/1984 |

(Continued)

OTHER PUBLICATIONS

U.S. Appl. No. 13/294,281, filed Nov. 11, 2011 entitled System and Method for Cooling and Cycling a Battery Pack.

(Continued)

*Primary Examiner* — M'Baye Diao
(74) *Attorney, Agent, or Firm* — Buckert Patent & Trademark Law Firm, PC; John F. Buckert

(57) ABSTRACT

A system for determining an isolation resistance is provided. The system includes a voltage source that applies an output voltage level between first and second electrical terminals of a battery pack. The system further includes a voltage meter that measures a first voltage level between the first electrical terminal and a vehicle chassis, and measures a second voltage level between the first electrical terminal and the vehicle chassis when a resistor is coupled between the first electrical terminal and the vehicle chassis. The voltage meter measures a third voltage level between the second electrical terminal and the vehicle chassis. The system further includes a microprocessor that determines a first isolation resistance value based on the first, second, third voltage levels and the predetermined resistance level.

14 Claims, 4 Drawing Sheets

(56) References Cited

U.S. PATENT DOCUMENTS

| | | |
|---|---|---|
| 7,974,797 B2 | 7/2011 | Shoji |
| 8,168,315 B1 * | 5/2012 | Hermann ..................... 429/92 |
| 8,487,631 B2 | 7/2013 | Yuasa et al. |
| 2001/0019270 A1 | 9/2001 | Onishi et al. |
| 2002/0062650 A1 | 5/2002 | Dukhan et al. |
| 2002/0193955 A1 | 12/2002 | Bertness et al. |
| 2003/0139888 A1 | 7/2003 | Burns |
| 2004/0108856 A1 | 6/2004 | Johnson |
| 2004/0204172 A1 | 10/2004 | Herle |
| 2005/0023054 A1 * | 2/2005 | Weidenheimer et al. .... 180/65.2 |
| 2005/0134283 A1 | 6/2005 | Potempa |
| 2005/0257533 A1 | 11/2005 | Gunawardana et al. |
| 2005/0264296 A1 | 12/2005 | Philbrook |
| 2006/0012341 A1 | 1/2006 | Burns |
| 2006/0164034 A1 * | 7/2006 | Hanyu et al. ................. 320/104 |
| 2007/0252555 A1 | 11/2007 | Potempa |
| 2007/0261415 A1 | 11/2007 | Barnes |
| 2008/0231257 A1 | 9/2008 | Williams |
| 2008/0290877 A1 | 11/2008 | Oh et al. |
| 2009/0243621 A1 | 10/2009 | Kudo et al. |
| 2009/0251149 A1 | 10/2009 | Buckner et al. |
| 2010/0102975 A1 | 4/2010 | Vossmeyer et al. |
| 2011/0050235 A1 | 3/2011 | Bogdan, Jr. et al. |
| 2011/0116225 A1 | 5/2011 | Staben et al. |
| 2011/0254558 A1 | 10/2011 | Stancu et al. |
| 2011/0256430 A1 | 10/2011 | Stancu et al. |
| 2011/0300416 A1 | 12/2011 | Bertness |
| 2012/0014020 A1 * | 1/2012 | Lehmann ..................... 361/42 |
| 2013/0015702 A1 | 1/2013 | Ito |
| 2013/0027049 A1 * | 1/2013 | Sukup ......................... 324/430 |
| 2013/0119937 A1 | 5/2013 | Arseneault et al. |
| 2013/0141105 A1 | 6/2013 | Tom et al. |
| 2014/0084934 A1 | 3/2014 | Bober |

FOREIGN PATENT DOCUMENTS

| | | |
|---|---|---|
| JP | H0797004 A | 4/1995 |
| JP | 1996163704 | 6/1996 |
| JP | H08185896 A | 7/1996 |
| JP | H1140212 A | 2/1999 |
| JP | 2002343318 A | 11/2002 |
| JP | 2005228659 A | 8/2005 |
| JP | 2007280794 A | 10/2007 |
| JP | 2010236981 A | 10/2010 |
| JP | 2012165536 | 4/2011 |
| KR | 20040072069 A | 8/2004 |
| KR | 20050001008 A | 1/2005 |
| KR | 20060068172 A | 6/2006 |
| KR | 20090015273 A | 2/2009 |
| KR | 20090024573 A | 9/2009 |
| KR | 20100003136 A | 1/2010 |
| KR | 20110064057 A | 6/2011 |
| KR | 20120057385 A | 6/2012 |

OTHER PUBLICATIONS

U.S. Appl. No. 13/308,817, filed Dec. 1, 2011 entitled Test System for a Battery Module.

International Search Report for International application No. PCT/KR2012/009014 dated Feb. 28, 2013.

* cited by examiner

SYSTEM AND METHOD FOR DETERMINING AN ISOLATION RESISTANCE OF A BATTERY PACK DISPOSED ON A VEHICLE CHASSIS

BACKGROUND

The inventors herein have recognized a need for an improved system and method for determining an isolation resistance of a battery pack disposed on a vehicle chassis.

SUMMARY

A system for determining an isolation resistance of a battery pack disposed on a vehicle chassis in accordance with an exemplary embodiment is provided. The battery pack has at least first and second battery modules. The battery pack further includes first and second electrical terminals. The system includes a voltage source configured to be electrically coupled to the first and second electrical terminals of the battery pack. The voltage source is configured to apply an output voltage level between the first and second electrical terminals that is indicative of a predetermined voltage level to be output by the battery pack when the first and second battery modules are not electrically coupled in series with one another. The system further includes a voltage meter configured to measure a first voltage level between the first electrical terminal and the vehicle chassis. The voltage meter is further configured to measure a second voltage level between the first electrical terminal and the vehicle chassis when a resistor is electrically coupled between the first electrical terminal and the vehicle chassis. The resistor has a predetermined resistance level. The voltage meter is further configured to measure a third voltage level between the second electrical terminal and the vehicle chassis. The system further includes a microprocessor configured to operably communicate with the voltage meter. The microprocessor is further configured to determine a first isolation resistance value associated with the battery pack based on the first voltage level, the second voltage level, the third voltage level, and the predetermined resistance level.

A method for determining an isolation resistance of a battery pack disposed on a vehicle chassis in accordance with another exemplary embodiment is provided. The battery pack has at least first and second battery modules. The battery pack further includes first and second electrical terminals. The method includes outputting an output voltage level indicative of a predetermined voltage level to be output by the battery pack between the first and second electrical terminals of the battery pack when the first and second battery modules are not electrically coupled in series with one another, utilizing a voltage source that is electrically coupled to the first and second electrical terminals. The method further includes measuring a first voltage level between the first electrical terminal and the vehicle chassis utilizing a voltage meter. The method further includes measuring a second voltage level between the first electrical terminal and the vehicle chassis utilizing the voltage meter when a resistor is electrically coupled between the first electrical terminal and the vehicle chassis. The resistor has a predetermined resistance level. The method further includes measuring a third voltage level between the second electrical terminal and the vehicle chassis utilizing the voltage meter. The method further includes determining a first isolation resistance value associated with the battery pack utilizing a microprocessor based on the first voltage level, the second voltage level, the third voltage level, and the predetermined resistance level. The method further includes storing the first isolation resistance value in a memory device utilizing the microprocessor.

DETAILED DESCRIPTION

Figure 1:
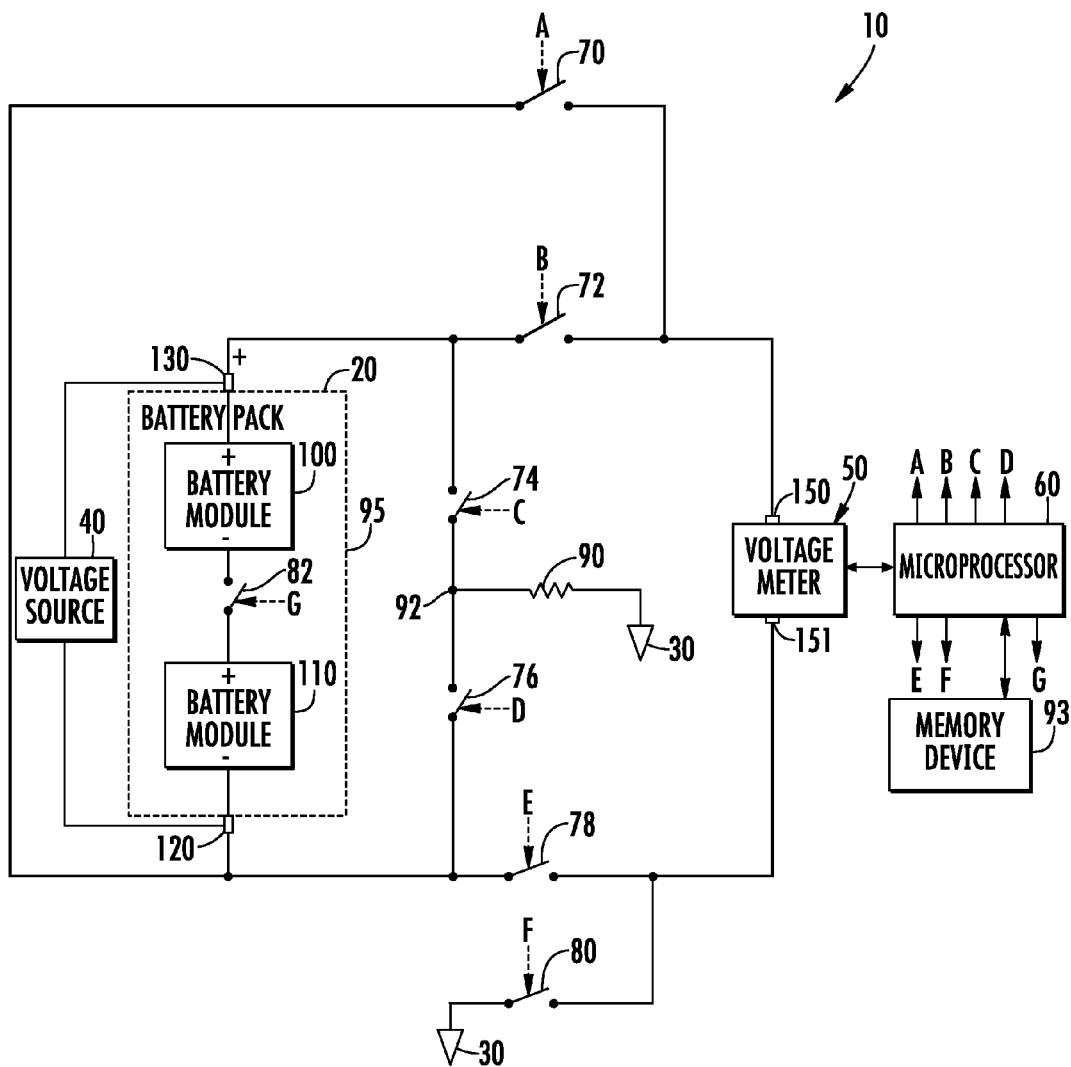
FIG. 1 is a schematic of a system for determining an isolation resistance of a battery pack disposed on a vehicle chassis in accordance with an exemplary embodiment.

Referring to FIG. 1, a system 10 for determining an isolation resistance of a battery pack 20 disposed on the vehicle chassis 30 in accordance with an exemplary embodiment is provided. The system 10 includes a voltage source 40, a voltage meter 50, a microprocessor 60, electrical switches 70, 72, 74, 76, 78, 80, 82, a resistor 90, and a memory device 93. An advantage of the system 10 is that the system 10 utilizes the voltage source 40 that supplies a predetermined voltage to the battery pack 20 while determining an isolation resistance of the battery pack 20, such that the battery pack 20 does not need to be fully-charged in order to determine the isolation resistance.

The battery pack 20 is provided to generate electrical power for either an electric vehicle or a hybrid electric vehicle. The battery pack 20 includes a housing 95, battery modules 100, 110, the electrical switch 82, a first electrical terminal 120, and a second electrical terminal 130. The housing 95 encloses the battery modules 100, 110 which are electrically coupled in series with one another. The first electrical terminal 120 is electrically coupled to a negative terminal of the battery module 110. The second electrical terminal 130 is electrical coupled to a positive terminal of the battery module 100. The negative terminal of the battery module 100 is electrically coupled to a first side of the switch 82. The positive terminal of the battery module 110 is electrically coupled to a second side of the electrical switch 82. The electrical switch 82 is an electrically-actuated switch and has a normally-closed operational position. The electrical switch 82 transitions to an open operational position in response to a control signal from the microprocessor 60 such that the battery modules 100, 110 are not electrically coupled in series with one another to allow the system 10 to perform the electrical isolation tests on the battery pack 20 as will be discussed in greater detail below.

In an alternative embodiment, the switch 82 could be removed such that the negative terminal of the battery module 110 is not electrically connected to the positive terminal of the battery module 110 when performing the electrical isolation tests described below. In other words, an open circuit would exist between the negative terminal of the battery module 100 and the positive terminal of the battery module 110 when performing the electrical isolations tests described below.

The vehicle chassis 30 is configured to hold a battery pack 20 thereon. The battery pack 20 is selectively electrically coupled to the vehicle chassis 30 for performing determining an electrical isolation resistance of the battery pack 20.

The voltage source 40 is configured to be electrically coupled to the first and second electrical terminals 120, 130 of the battery pack 20. The voltage source 40 is configured to apply an output voltage level between the first and second electrical terminals 120, 130 that is indicative of a predetermined voltage level to be output by the battery pack 20. In one exemplary embodiment, the voltage source 40 outputs 600 Vdc and 10 milli-Amps.

The voltage meter 50 is configured to measure a first voltage level (V1) between the first electrical terminal 120 and the vehicle chassis 30. When the voltage meter 50 measures the first voltage level (V1), the electrical switches 70, 78 each have a closed operational position, and the remaining switches have an open operational position. The voltage meter 50 is further configured to send data associated with the first voltage level (V1) to the microprocessor 60. In one exemplary embodiment, an internal resistance of the voltage meter 50 is at least 10 mega-Ohms.

The voltage meter 50 is further configured to measure a second voltage level (V2) between the first electrical terminal 120 and the vehicle chassis 30 when a resistor 90 is electrically coupled between the first electrical terminal 120 and the vehicle chassis 30. When the voltage meter 50 measures the second voltage level (V2), the electrical switches 70, 78, 76 each have a closed operational position, and the remaining switches have an open operational position. In one exemplary embodiment, the resistor 90 has a predetermined resistance level (R0), such as 200 kilo-Ohms for example. The voltage meter 50 is further configured to send data associated with the second voltage level (V2) to the microprocessor 60.

The voltage meter 50 is further configured to measure a third voltage level (V3) between the second electrical terminal 130 and the vehicle chassis 30. When the voltage meter 50 measures the third voltage level (V3), the electrical switches 72, 80 each have a closed operational position, and the remaining switches have an open operational position. The voltage meter 50 is further configured to send data associated with the third voltage level (V3) to the microprocessor 60.

The voltage meter 50 is further configured to measure a fourth voltage level (V4) between the second electrical terminal 130 and the vehicle chassis 30 when the resistor 90 is electrically coupled between the second electrical terminal 130 and the vehicle chassis 30. When the voltage meter 50 measures the fourth voltage level (V4), the electrical switches 72, 74, 80 each have a closed operational position, and the remaining switches have an open operational position. The voltage meter 50 is further configured to send data associated with the fourth voltage level (V4) to the microprocessor 60.

The switches 70, 72, 74, 76, 78, 80 are electrically actuated switches. In particular, the switches 70-80 either have a closed operational position or an open operational position. The microprocessor 60 generates control signals which are received by the switches 70-80 which induce the switches to have a closed operational position. For example, the microprocessor 60 generates a control signal that is received by the switch 70 to induce the switch 70 to have a closed operational position. When the microprocessor 60 stops generating the control signals which are received by the switches 70-80, the switches transition to an open operational position. For example, when the microprocessor 60 stops generating a control signal that is received by the switch 70, the switch 70 transitions to an open operational position.

A brief description of the electrical configuration of the system 10 will now be provided. The switch 70 is electrically coupled between the first electrical terminal 120 of the battery pack 20 and the first electrical terminal 150 of the voltage meter 50. The switch 72 is electrically coupled between the second electrical terminal 130 of the battery pack 20 and the first electrical terminal 150 of the voltage meter 50. The switch 74 is electrically coupled between the electrical terminal 130 of the battery pack 20 and a node 92. The resistor 90 is electrically coupled between the node 92 and the vehicle chassis 30. The switch 76 is electrically coupled between the node 92 and the first electrical terminal 120 of the battery pack 20. The switch 78 is electrically coupled between the first electrical terminal 120 of the battery pack 20 and the second electrical terminal 151 of the voltage meter 50. Further, the switch 80 is electrically coupled between the second electrical terminal 151 of the voltage meter 50 and the vehicle chassis 30.

The microprocessor 60 is configured to operably communicate with the voltage meter 50. The microprocessor 60 is configured to determine a first isolation resistance value (R1) associated with the battery pack based on the following equation: $R1=R0(1+V3/V1)[(V1-V2)/V2]$.

The microprocessor 60 is configured to determine a second isolation resistance value (R2) associated with the battery pack 20 based on the following equation: $R1=R0(1+V1/V3)[(V3-V4)/V4]$.

If the first isolation resistance value (R1) is less than the second isolation resistance value (R2), then the microprocessor 60 is configured to determine a first test value by dividing the first isolation resistance value (R1) by the output voltage level of the voltage source. The microprocessor 60 is further configured to set a first test flag equal to a test failure value if the first test value is less than a predetermined test value.

However, if the second isolation resistance value (R2) is less than the first isolation resistance value (R1), then the microprocessor 60 is configured to determine a second test value by dividing the second isolation resistance value (R2) by the output voltage level of the voltage source. The microprocessor 60 is further configured to set the first test flag equal to the test failure value if the second test value is less than the predetermined test value.

Figure 2:
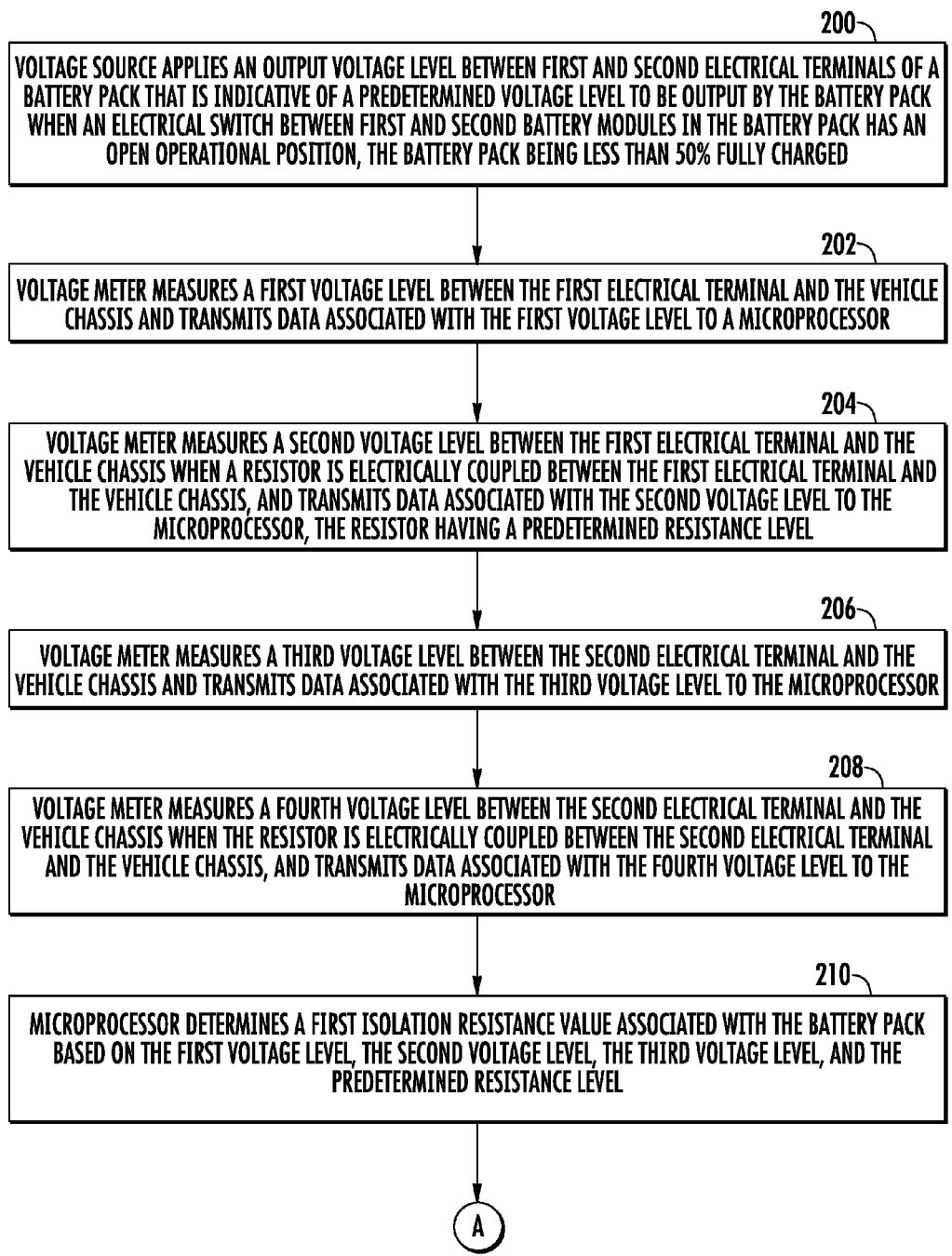
FIGS. 2-4 are flowcharts of a method for determining an isolation resistance of a battery pack disposed on a vehicle chassis in accordance with another exemplary embodiment.
Figure 3:
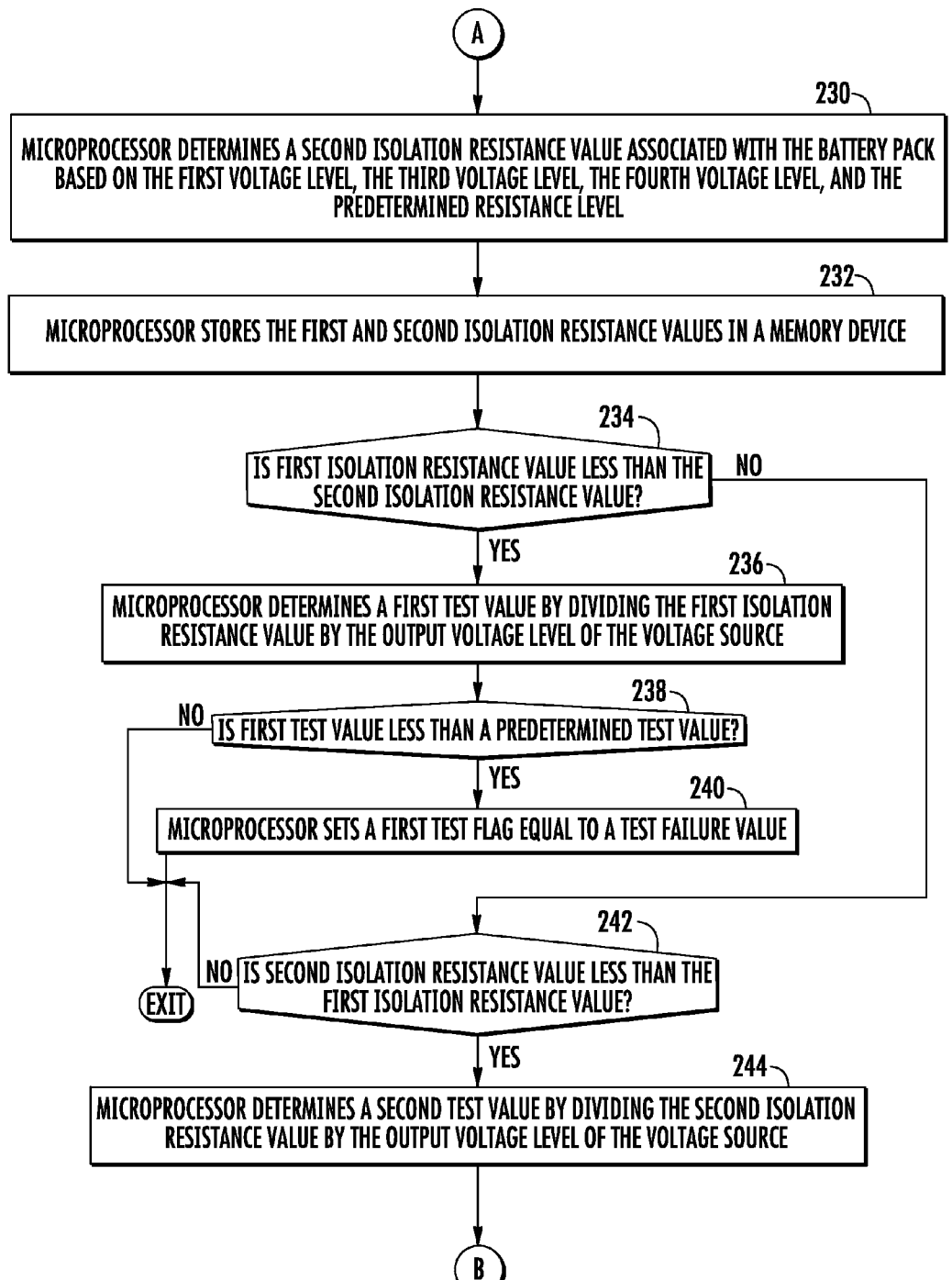
Figure 4:
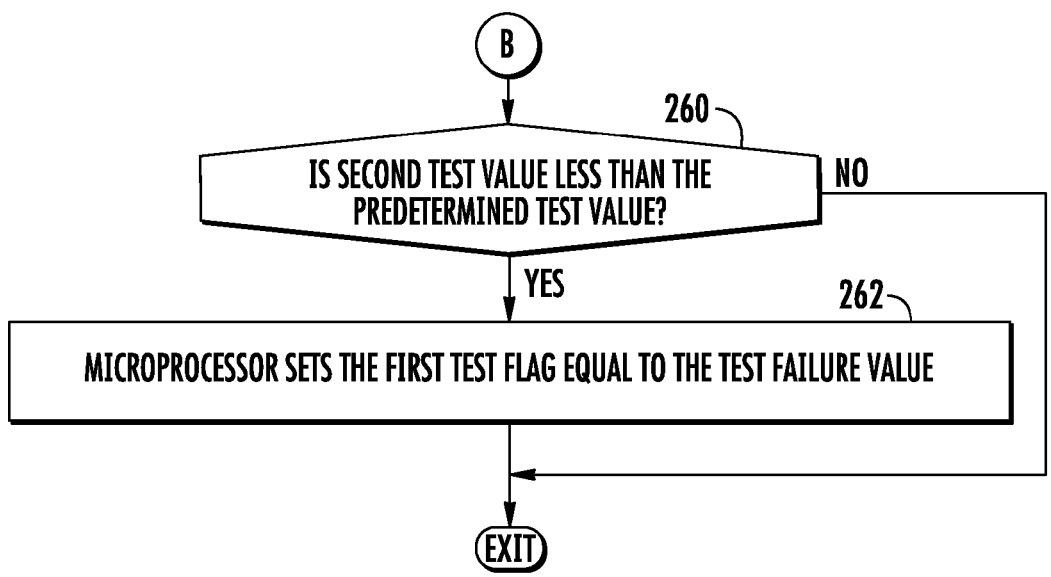

Referring to FIGS. 1-3, a flowchart of a method for determining an isolation resistance of the battery pack 20 in accordance with another exemplary embodiment will now be explained.

At step 200, the voltage source 40 applies an output voltage level between first and second electrical terminals 120, 130 of the battery pack 20 that is indicative of a predetermined voltage level to be output by the battery pack 20, when an electrical switch between first and second battery modules in the battery pack has an open operational position. The battery pack is less than 50% fully charged. After step 200, the method advances to step 202.

At step 202, the voltage meter 50 measures a first voltage level (V1) between the first electrical terminal 120 and the vehicle chassis 30 and transmits data associated with the first voltage level (V1) to the microprocessor 60. After step 202, the method advances to step 204.

At step 204, the voltage meter 50 measures a second voltage level (V2) between the first electrical terminal 120 and the vehicle chassis 30 when the resistor 90 is electrically coupled between the first electrical terminal 120 and the vehicle chassis 30, and transmits data associated with the second voltage level (V2) to the microprocessor 60. The resistor 90 has a predetermined resistance level (R0). After step 204, the method advances to step 206.

At step 206, the voltage meter 50 measures a third voltage level (V3) between the second electrical terminal 130 and the vehicle chassis 30 and transmits data associated with the third voltage level (V3) to the microprocessor 60. After step 206, the method advances to step 208.

At step 208, the voltage meter 50 measures a fourth voltage level (V4) between the second electrical terminal 130 and the vehicle chassis 30 when the resistor 90 is electrically coupled between the second electrical terminal 130 and the vehicle chassis 30, and transmits data associated with the fourth voltage level (V4) to the microprocessor 60. After step 208, the method advances to step 210.

At step 210, the microprocessor 60 determines the first isolation resistance value (R1) associated with the battery pack based on the first voltage level (V1), the second voltage level (V2), the third voltage level (V3), and the predetermined resistance level (R0). After step 210, the method advances to step 230.

At step 230, the microprocessor 60 determines a second isolation resistance value (R2) associated with the battery pack 20 based on the first voltage level (V1), the third voltage level (V3), the fourth voltage level (V4), and the predetermined resistance level (R0). After step 230, the method advances to step 232.

At step 232, the microprocessor 60 stores the first and second isolation resistance values (R1), (R2) in the memory device 93. After step 232, the method advances to step 234.

At step 234, the microprocessor 60 makes a determination as to whether the first isolation resistance value (R1) is less than the second isolation resistance value (R2). The value of step 234 equals "yes", the method advances to step 236. Otherwise, the method advances to step 242.

At step 236, the microprocessor 60 determines a first test value by dividing the first isolation resistance value (R1) by the output voltage level of the voltage source 40. After step 236, the method advances to step 238.

At step 238, the microprocessor 60 makes a determination as to whether the first test value is less than a predetermined test value. If the value of step 238 equals "yes", the method advances to step 240. Otherwise, the method is exited.

At step 240, the microprocessor 60 sets a first test flag equal to a test failure value. After step 240, the method is exited.

Referring again to step 234, if the value of step 234 equals "no", the method advances to step 242. At step 242, the microprocessor 60 makes a determination as to whether the second isolation resistance value (R2) is less than the first isolation resistance value (R1). If the value of step 242 equals "yes", the method advances to step 244. Otherwise, the method is exited.

At step 244, the microprocessor 60 determines a second test value by dividing the second isolation resistance value (R2) by the output voltage level of the voltage source 40. After step 244, the method advances to step 260.

At step 260, the microprocessor 60 makes a determination as to whether the second test value is less than the predetermined test value. If the value of step 260 equals "yes", the method advances to step 262. Otherwise, the method is exited.

At step 262, the microprocessor 60 sets the first test flag equal to the test failure value. After step 262, the method is exited.

The above-described method can be at least partially embodied in the form of one or more computer readable media having computer-executable instructions for practicing the method. The computer-readable media can comprise one or more of the following: hard drives, flash memory, CD-ROMs, and other computer-readable media known to those skilled in the art; wherein, when the computer-executable instructions are loaded into and executed by one or more microprocessors or computers, the one or more microprocessors or computers become an apparatus for practicing the invention.

The system and the method for determining an isolation resistance of the battery pack 20 provides a substantial advantage over other systems and methods. In particular, the system 10 and the method provide a technical effect of utilizing a voltage source that supplies a predetermined voltage to the battery pack 20 while determining an isolation resistance of the battery pack 20, such that the battery pack 20 does not need to be fully-charged in order to determine the isolation resistance.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for determining an isolation resistance of a battery pack disposed on a vehicle chassis, the battery pack having at least first and second battery modules, the battery pack further having first and second electrical terminals, comprising:
   a voltage source configured to be electrically coupled to the first and second electrical terminals of the battery pack, the voltage source configured to apply an output voltage level between the first and second electrical terminals that is indicative of a predetermined voltage level to be output by the battery pack when the first and second battery modules are not electrically coupled in series with one another;
   a voltage meter configured to measure a first voltage level between the first electrical terminal and the vehicle chassis;
   the voltage meter further configured to measure a second voltage level between the first electrical terminal and the vehicle chassis when a resistor is electrically coupled between the first electrical terminal and the vehicle chassis, the resistor having a predetermined resistance level;
   the voltage meter further configured to measure a third voltage level between the second electrical terminal and the vehicle chassis; and
   a microprocessor configured to operably communicate with the voltage meter, the microprocessor further configured to determine a first isolation resistance value associated with the battery pack based on the first voltage level, the second voltage level, the third voltage level, and the predetermined resistance level.

2. The system of claim 1, wherein the voltage meter is further configured to measure a fourth voltage level between the second electrical terminal and the vehicle chassis when the resistor is electrically coupled between the second electrical terminal and the vehicle chassis.

3. The system of claim 2 wherein the microprocessor is further configured to determine a second isolation resistance value associated with the battery pack based on the first voltage level, the third voltage level, the fourth voltage level, and the predetermined resistance level.

4. The system of claim 3, wherein:
   if the first isolation resistance value is less than the second isolation resistance value, then the microprocessor further configured to determine a first test value by dividing the first isolation resistance value by the output voltage level of the voltage source; and
   the microprocessor further configured to set a first test flag equal to a test failure value if the first test value is less than a predetermined test value.

5. The system of claim 4, wherein:
if the second isolation resistance value is less than the first isolation resistance value, then the microprocessor further configured to determine a second test value by dividing the second isolation resistance value by the output voltage level of the voltage source; and
the microprocessor further configured to set the first test flag equal to the test failure value if the second test value is less than the predetermined test value.

6. The system of claim 1, wherein the battery pack is less than 50% fully charged.

7. The system of claim 1, wherein the voltage source is configured to apply the output voltage level between the first and second electrical terminals when a switch that is electrically coupled between the first and second battery modules has an open operational position.

8. A method for determining an isolation resistance of a battery pack disposed on a vehicle chassis, the battery pack having at least first and second battery modules, the battery pack further having first and second electrical terminals, comprising:
outputting an output voltage level indicative of a predetermined voltage level to be output by the battery pack between the first and second electrical terminals of the battery pack when the first and second battery modules are not electrically coupled in series with one another, utilizing a voltage source that is electrically coupled to the first and second electrical terminals;
measuring a first voltage level between the first electrical terminal and the vehicle chassis utilizing a voltage meter;
measuring a second voltage level between the first electrical terminal and the vehicle chassis utilizing the voltage meter when a resistor is electrically coupled between the first electrical terminal and the vehicle chassis, the resistor having a predetermined resistance level;
measuring a third voltage level between the second electrical terminal and the vehicle chassis utilizing the voltage meter;
determining a first isolation resistance value associated with the battery pack utilizing a microprocessor based on the first voltage level, the second voltage level, the third voltage level, and the predetermined resistance level; and
storing the first isolation resistance value in a memory device utilizing the microprocessor.

9. The method of claim 8, further comprising measuring a fourth voltage level between the second electrical terminal and the vehicle chassis utilizing the voltage meter when the resistor is electrically coupled between the second electrical terminal and the vehicle chassis.

10. The method of claim 9, further comprising:
determining a second isolation resistance value associated with the battery pack utilizing the microprocessor based on the first voltage level, the third voltage level, the fourth voltage level, and the predetermined resistance level; and
storing the second isolation resistance value in the memory device utilizing the microprocessor.

11. The method of claim 10, further comprising:
if the first isolation resistance value is less than the second isolation resistance value, then determining a first test value by dividing the first isolation resistance value by the output voltage level of the voltage source utilizing the microprocessor; and
setting a first test flag equal to a test failure value if the first test value is less than a predetermined test value utilizing the microprocessor.

12. The method of claim 11, further comprising:
if the second isolation resistance value is less than the first isolation resistance value, then determining a second test value by dividing the second isolation resistance value by the output voltage level of the voltage source utilizing the microprocessor; and
setting the first test flag equal to the test failure value if the second test value is less than the predetermined test value utilizing the microprocessor.

13. The method of claim 12, wherein the battery pack is less than 50% fully charged when outputting the output voltage level from the voltage source to the first and second electrical terminals of the battery pack.

14. The method of claim 8, wherein outputting the output voltage level comprises outputting the output voltage level between the first and second electrical terminals when a switch that is electrically coupled between the first and second battery modules has an open operational position.

* * * * *